United States Patent
Walker (10) Patent No.: US 8,358,143 B2
(45) Date of Patent: Jan. 22, 2013

(54) INTERNAL SELF-CHECK RESISTANCE BRIDGE AND METHOD

(75) Inventor: Richard W. Walker, Alpine, UT (US)

(73) Assignee: Fluke Corporation, Everett, WA (US)

( * ) Notice: Subject to any disclaimer, the term of this patent is extended or adjusted under 35 U.S.C. 154(b) by 457 days.

(21) Appl. No.: 12/497,296

(22) Filed: Jul. 2, 2009

(65) Prior Publication Data

US 2011/0001501 A1  Jan. 6, 2011

(51) Int. Cl.
*G01R 27/08* (2006.01)
(52) U.S. Cl. .................................... 324/706
(58) Field of Classification Search ........... 324/706, 324/705, 691, 649, 600
See application file for complete search history.

(56) References Cited

U.S. PATENT DOCUMENTS

| | | | |
|---|---|---|---|
| 3,676,774 A * | 7/1972 | Stokes et al. | 324/706 |
| 5,371,469 A | 12/1994 | Anderson | |
| 2011/0001502 A1 | 1/2011 | Walker | |

FOREIGN PATENT DOCUMENTS

FR  2637985 A1  4/1990

OTHER PUBLICATIONS

"Extended European Search Report dated Dec. 9, 2010 regarding Application No. 10167912.4".
Anonymous, "Operator Manual for Resistance Bridge Calibrators", RBC operators manual, Dec. 2007, pp. 1-41.
Parks, James E., "Ohm's Law III—Resistors in Series and Parallel", Aug. 2007, pp. 1-18.
Walker, R. et al., "Achieving 0.25 mK Uncertainty with an Integrated-Circuit Resistance Thermometer Readout", Proceedings, XVII IMEKO World Congress, Jun. 22-27, 2003, pp. 1594-1597.
Lacanette, K., "Data-Acquisition System Simplifies 5V RTD-to-Digital Conversion," 41(24):102, EDN—Electrical Design News, Nov. 1996.

* cited by examiner

*Primary Examiner* — Hoai-An D Nguyen
(74) *Attorney, Agent, or Firm* — Christensen O'Connor Johnson Kindness PLLC (57) ABSTRACT

One or more embodiments are directed to a resistance bridge measurement circuit configured to perform an internal self-check. The resistance bridge measurement circuit may include two or more internal resistors. In one embodiment, the resistance bridge measurement circuit may be configured to measure a first voltage across one of the resistors and a second voltage across a combination of the two resistors. The measured voltages may be converted to a resistance ratio and compared to an expected value. In another embodiment, the resistance bridge measurement circuit may be configured to measure a third voltage across the other of the two resistors and a fourth voltage across a combination of the two resistors. The measured voltages may be converted to corresponding resistance ratios, summed and compared to an expected value.

20 Claims, 5 Drawing Sheets

INTERNAL SELF-CHECK RESISTANCE BRIDGE AND METHOD

TECHNICAL FIELD

This invention is directed to resistance bridges, and more particularly one or more embodiments are directed to resistance bridge measurement circuits operable to perform an internal calibration and/or verification check.

BACKGROUND OF THE INVENTION

A resistance bridge is a device for comparing resistors by measuring and calculating a ratio between the resistors. For instance, a resistance bridge may be used to determine a resistance value of a first resistor that is electrically coupled to a second resistor. The resistance bridge measures electrical parameters of the two resistors, and, based on the electrical measurements, a microprocessor coupled to the resistance bridge calculates a resistance ratio of the two resistors. Resistance bridges may be used in a wide variety of applications that may use resistance measurements, such as thermometers, resistor calibrators, multimeters and the like. In general, resistance bridge measurement circuits provide high accuracy measurements. However, the accuracy of any circuit depends on the stability of the electrical components within the circuit.

To verify the accuracy of a resistance bridge measurement circuit a test or calibration may be performed. In some cases, a linearity test may be performed to test the accuracy of the range at which the resistance bridge can compare resistors. More particularly, a linearity test may verify the ability of a measurement circuit to accurately measure an output parameter, such as a voltage across two resistors, across a range of input values. In general, during a linearity test a variety of measurements may be performed and compared to expected results.

In the prior art, external resistors are coupled to a resistance bridge to perform a linearity test. In general, it may be difficult to perform a linearity test because a user typically may be required to make complex electrical calculations and/or connect a variety of external resistors to the resistance bridge. Thus, linearity tests require a substantial amount of time and technical expertise from the user. Furthermore, during a linearity test it is important that the stability of the electrical components be carefully controlled during testing. For instance, it may be difficult to precisely know the resistances of the resistors during testing. Additionally, the greater the number of measurements made, the more accurate the test. This all, however, adds to the complexity of conducting a linearity test because more calculations may be required and more resistors may be required to be connected and/or disconnected to the resistance bridge measurement circuit. Therefore, calibrating or testing a resistance bridge measurement circuit requires a great deal of time and expertise from the user.

There is, therefore, a need for a resistance bridge measurement circuit verification or calibration test that provides consistent and accurate results that are quickly and easily implemented by a user.

DETAILED DESCRIPTION

Embodiments of the present invention are directed toward a resistance bridge operable to perform an internal self-check and/or calibration. One or more embodiments utilize a resistance bridge measurement circuit comprising a network of resistors for performing an internal self-check test to calibrate and/or verify the accuracy of the resistance bridge measurement circuit. In one embodiment, the network of resistors are internal to the resistance bridge. The network of resistors may include any variety of combination of resistors and may be reconfigurable. The resistors may have similar resistances or different resistances. Some or all of the resistors may be coupled together, such as in series or in parallel or alternatively, may be configured to a first configuration and reconfigurable to a second configuration. The network of resistors may include any number of resistors. The resistance of the resistors may be known or unknown, or any combination thereof. The self-check test may include a variety of internal tests, such as a linearity test, a compliments test, a zero check, and/or the like. Certain details are set forth below to provide a sufficient understanding of the invention. However, it will be clear to one skilled in the art that the invention may be practiced without these particular details.

Figure 1A:
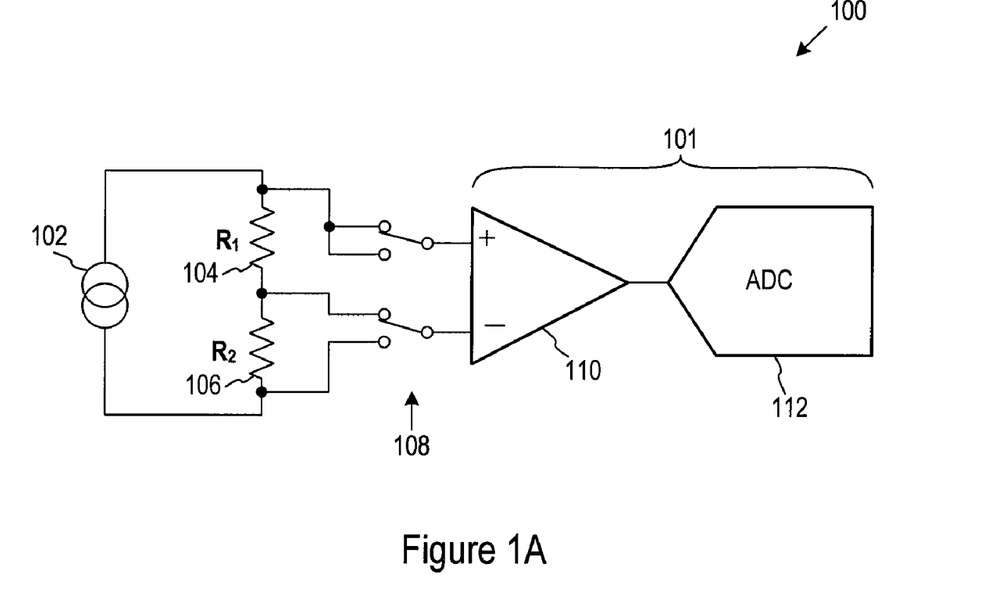
FIG. 1A is a schematic diagram of a resistance bridge measurement circuit in a first state according to one embodiment of the invention.

FIG. 1A is a schematic diagram of a resistance bridge measurement circuit 100 in a first state comprising an internal self-check test according to one embodiment. The resistance bridge measurement circuit 100 may include a current source 102, internal resistors $R_1$ 104 and $R_2$ 106, switches 108, and a measurement circuit 101. As will be clear to a person having ordinary skill in the art, the measurement circuit 101 may be configured to measure any electrical parameter, such as voltage. In one embodiment, the measurement circuit 101 may further include an amplifier 110 and an analog to digital converter (ADC) 112. In another embodiment, the measurement circuit 101 may include an ADC 112 coupled directly to switches 108.

As is illustrated in FIG. 1A, the internal resistors $R_1$ 104 and $R_2$ 106 may be coupled in series. In other embodiments, however, internal resistors may be reconfigurable to any configuration, such as in parallel and/or in series, and may include any number of resistors. As indicated above, the resistance of the internal resistors $R_1$ 104 and $R_2$ 106 may be known or unknown. The resistors $R_1$ 104 and $R_2$ 106 may be any type of resistor. In one embodiment, the resistors $R_1$ 104 and $R_2$ 106 may have a resistance between 0 and 500 kiloohms. In some embodiments, the resistors have resistances between 5 and 400 ohms. When current is provided to the circuit 100 by the current source 102, current flows through the set of resistors $R_1$ 104 and $R_2$ 106 simultaneously and a voltage across each resistor $R_1$ 104 and $R_2$ 106 is generated that is proportional to each resistor's resistance. In one embodiment, the current source 102 is reversible.

The measurement circuit 101 may be configured to measure the voltage across each resistor $R_1$ 104 and $R_2$ 106 individually and/or a combination of the resistors, such as across both resistors $R_1$ and $R_2$. In a microprocessor (not shown), the measured voltage may be converted to a ratio, such as voltage ratio, which correspondence to a resistance ratio. As will be discussed in more detail below, the ratio may be compared to expected or measured values to perform an internal self calibration test of the resistance bridge measurement circuit 100.

The switches 108 may be any type of switch operable to change state. The switches 108 may be a single switch or two separate switches that function in tandem. In one embodiment, the switches 108 are relay switches, such as an electromechanical relay switch. In another embodiment, the switches 108 are analog switches. The switches 108 may be configured to couple the measurement circuit 101 to particular nodes of each resistor or combination of resistors. For instance, the state illustrated in FIG. 1A shows the switches 108 coupling the measurement circuit 101 across resistor $R_1$ 104. In particular, a first switch couples a first node of the amplifier 110 to a first node of the resistor $R_1$ and a second switch couples a second node of the amplifier 110 to a second node of the resistor $R_1$. While the switches 108 remain in this state, the measurement circuit 101 measures the voltage $V_1$ across the internal resistor $R_1$ 104.

Once the measurement is complete, the switches 108 may change state or flip. In the changed state, the first switch couples the measurement circuit 101 across the combination of resistors $R_1$ 104 and $R_2$ 106. In particular, the first node of the amplifier 110 remains coupled to the first node of the resistor $R_1$ 104 and the second node of the amplifier 110 may be coupled to a node of the resistor $R_2$ 106. In this configuration the measurement circuit 101 is coupled so that it may measure the voltage $V_{(1+2)1}$ across the combination of internal resistors $R_1$ 104 and $R_2$ 106. In a microprocessor the voltage $V_1$ and the voltage $V_{(1+2)1}$ may be converted to a first voltage ratio, such as $V_1/V_{(1+2)1}$. The first voltage ratio corresponds to a first resistance ratio $R_{R1}/(R_{R1+R2)1})$.

Figure 1B:
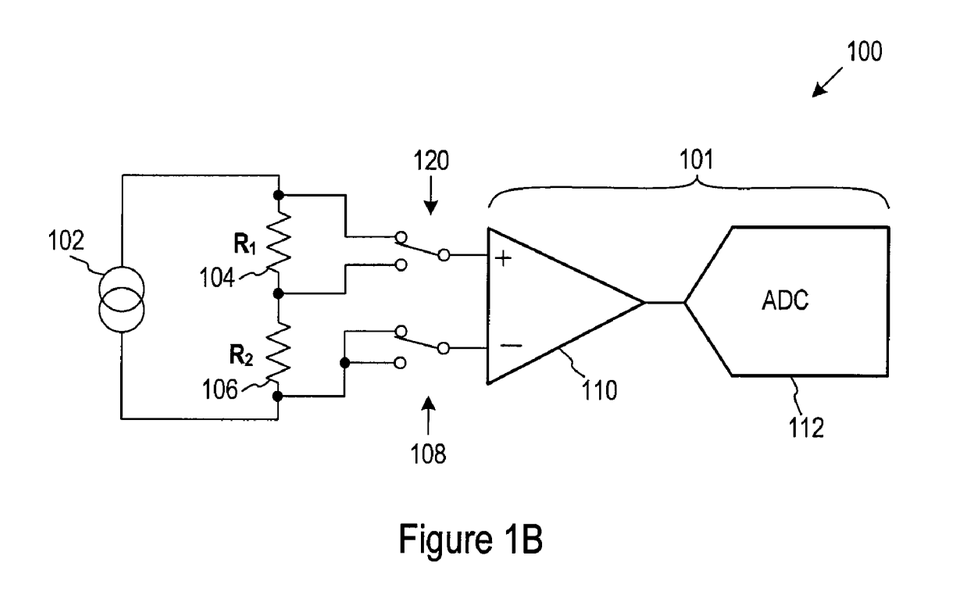
FIG. 1B is a schematic diagram of a resistance bridge measurement circuit in FIG. 1A in a second state according to one embodiment of the invention.

The resistance bridge measurement circuit 100 may include a second switch (not shown) adapted to reconfigure the circuit 100. For instance, the second switch may be coupled to the resistors $R_1$ 104 and $R_2$ 106 and be operable to reconfigure the circuit 100 to the configuration shown in FIG. 1B. FIG. 1B is a schematic diagram of a resistance bridge measurement circuit 100 in a second state 120 according to one embodiment of the invention. While the resistance bridge measurement circuit 100 is in this configuration, another set of measurements may be made to determine a second ratio. For instance, the switches 108 positioned in the state illustrated in FIG. 1B show the switches 108 coupling the measurement circuit 101 across the combination of resistors $R_1$ 104 and $R_2$ 106. In this state, the measurement circuit 101 measures a second voltage $V_{(1+2)2}$ across the combination of resistors $R_1$ 104 and $R_2$ 106. Once the measurement is complete, the switches 108 may change state or flip. When the switches 108 flip, the switches couple the measurement circuit 101 across resistor $R_2$ 106. In this configuration the measurement circuit 101 measures the voltage $V_2$ across the resistor $R_2$ 106. In a microprocessor the voltage $V_2$ and the voltage $V_{(1+2)2}$ may be converted to a second voltage ratio, such as $V_2/V_{(1+2)2}$. The second voltage ratio corresponds to a second resistance ratio $R_{R2}/(R_{R1+R2)2})$. As will be clear to a person having ordinary skill in the art, the second voltage $V_{(1+2)2}$ across the combination of resistors $R_1$ 104 and $R_2$ 106 may not be measured. Rather, when calculating the second voltage ratio, the voltage $V_{(1+2)1}$ may be used in place of the voltage ratio $V_{(1+2)2}$.

In one embodiment, a microprocessor may sum the first and second ratios, such as the first and second resistance ratios $R_{R1}/(R_{R1+R2)1})$ and $R_{R2}/(R_{R1+R2)2})$, to determine whether the measurement circuit 101 has linearity. If the sum of the first and second resistance ratios are equal to one, the resistance bridge measurement circuit 100 is linear. If, however, the sum of the first and second resistance ratios is substantially less than or greater than one, the resistance bridge measurement circuit 100 is operating nonlinearly. For instance, if the sum of the resistance ratios is 0.95, the resistance bridge measurement circuit 100 is operating nonlinearly. If the resistance bridge is nonlinear, this indicates that the ADC 112 and/or the amplifier 110 of the measurement circuit 101 have some imperfections. That is, the measurement circuit 101 inaccurately measured the actual voltage across at least one of the resistors $R_1$ 104 and $R_2$ 106. As will be clear to a person having ordinary skill in the art, the resistance values of the resistors $R_1$ 104 and $R_2$ 106 need not be known. In one embodiment, the resistors $R_1$ 104 and $R_2$ 106 are precision resistors such that their resistance value remains reasonably constant during a measurement.

Figure 2:
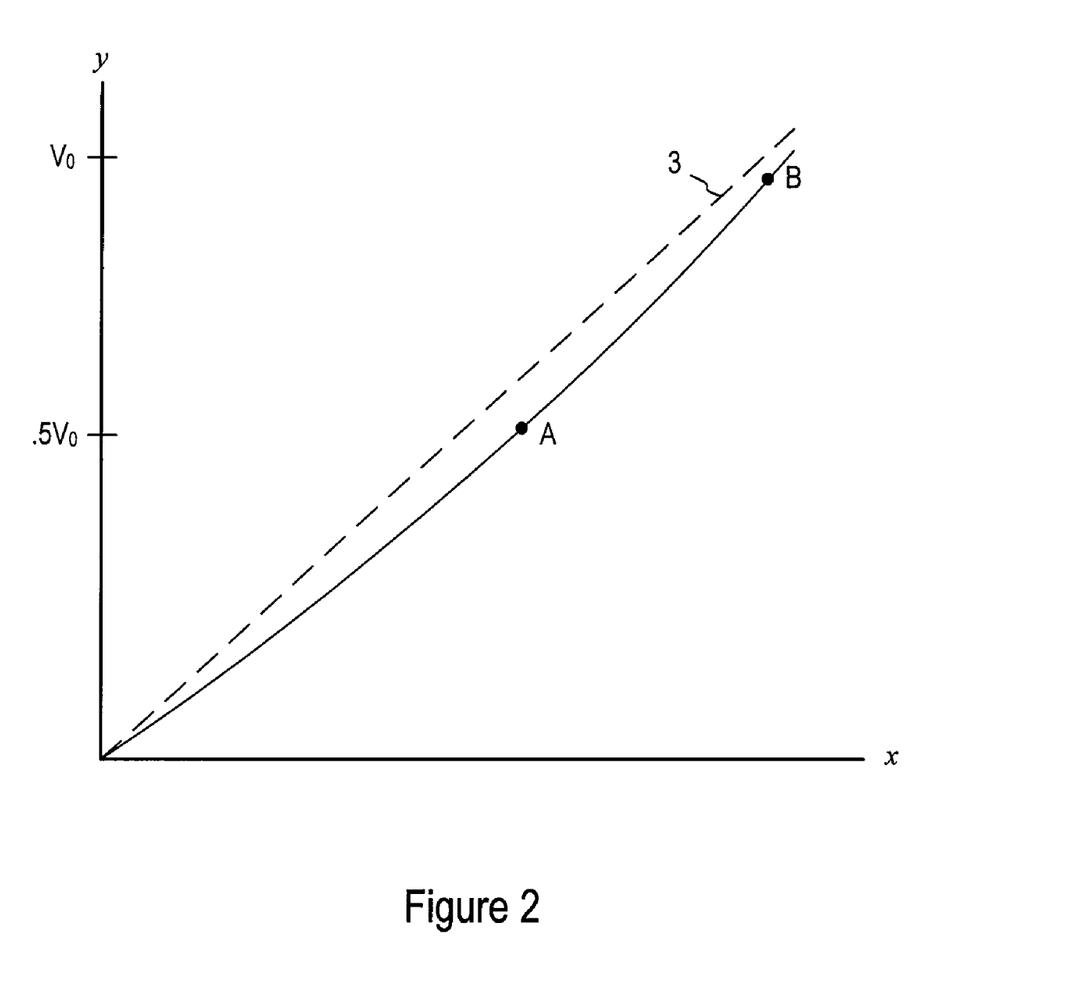
FIG. 2 shows an output-versus-input signal graph that illustrates a non-linear measurement circuit according to one embodiment of the invention.

FIG. 2 shows an output-versus-input signal graph that illustrates a non-linear measurement circuit according to one embodiment of the invention. The y-axis of the graph is the digital output value of the ADC 112 in the measurement circuit 101 (of FIG. 1) and the x-axis of the graph is the true voltage being input to the measurement circuit 101. The dashed line 3 illustrates an example of measurements made by a measurement circuit, in which the circuit is operating linearly. In this embodiment, the resistance values of each resistor $R_1$ 104 and $R_2$ 106 are equal. As will be clear to a person having ordinary skill in the art, when the resistance values of the resistors $R_1$ 104 and $R_2$ 106 are equal, the value of the voltage measured across the resistance $R_1$ 104 should be 0.5 of the voltage across the combination of resistors $R_1$ 104 and $R_2$ 106 if the measurement circuit is operating in a linear manner. In FIG. 2, the digital output value $V_0$ represents the measured voltage across both resistors $R_1$ 104 and $R_2$ 106 and 0.5$V_0$ represents the measured voltage across resistor $R_1$ 104. Point A represents a first measured voltage across resistor $R_1$ 104 compared to an actual voltage across resistor $R_1$ 104 and point B represents the voltage measured across both resistors $R_1$ 104 and $R_2$ 106 compared to an actual voltage across the combination of $R_1$ 104 and $R_2$ 106. Because the origin of the graph and points A and B do not form a straight line, but rather form a curved line, the measurement circuit is operating nonlinearly.

If a measurement circuit is operating nonlinearly, there may be a particular measurement error associated with the nonlinearity. When the resistors have the same resistance, such as in the embodiment discussed above, the measurement error may be deduced from the error calculated by the microprocessor. In particular, as will be clear to a person having ordinary skill in the art, the error in the sum of the first and second measured resistance ratios $R_{R1}/(R_{R1+R2})$ and $R_{R2}/(R_{R1+R2})$ will be approximately two times the error in each of the two measurements. The measurement error in some embodiments, however, may not be exactly two times the error due to drift in the circuit source or instability of one of the resistors. In addition to drift and instability of the electrical components, electrical noise in the measurement circuit may also be a cause of error. In some embodiments, the measurement error may be checked to determine if it is within a particular acceptable range. If the measurement error is outside of an allowed range, the resistance bridge may require adjustment or servicing.

As will be clear to a person having ordinary skill in the art, by testing only two internal resistors having the same resistance, the breadth of the range in which the resistance bridge measurement circuit is tested may be narrowed. In particular, a measurement error in a resistor having a resistance of 100 ohms may have a significantly different error associated with a resistor having a different resistance, such as a resistance of 25 ohms. Therefore, the above technique may be used to test a second set of resistors, each having a different resistance from each other. The second set of resistors may have a resistance that is known, unknown, or any combination thereof.

In some embodiments, the internal resistors may be temperature controlled during the self-check or calibration test. By controlling the temperature of the resistors during the linearity test, the stability of the resistors may be better controlled. For instance in one embodiment, thermoelectric modules may maintain the temperature of the resistors within 0.01° C. By performing the self-check, such as a linearity test, on resistors inside of the resistor bridge, the results may be more accurate and the test easier to perform by a user. For instance, using internal resistors resolves measurement errors that occur due to resistance instability of a wire coupling external resistors to the resistance bridge. In particular, by using internal resistors, the resistors may be coupled together with a low and stable resistance between them. This provides a more accurate measurement. By reducing these errors, the accuracy of the linearity test is improved. In particular, any errors caused by the resistance instability of the wires coupling the external resistors to the resistance bridge measurement circuit will not be included in the measurement. Additionally, a user would not have to couple resistors together in different configurations or perform complex calculations in order to conduct a test.

In some embodiments, some of the measurements or another complete set of measurements may be made in which the current in the circuit 100 is reversed. By first measuring the voltage with current flowing in a first direction and then measuring the voltage with current flowing in the opposite direction, offset voltages in the measurement circuit 101 may be eliminated, such as voltages that arise from thermoelectric electromotive force (EMF). In particular, each voltage measurement may be subtracted from its corresponding voltage measurement with current flowing in the opposite direction before calculating the voltage ratio and corresponding resistance ratio. For instance, a voltage $V_{1c}$ across resistor $R_1$ 104 with current flowing in a clockwise direction may be subtracted from a voltage $V_{1cc}$ across resistor $R_1$ 104 with current flowing in a counter clockwise direction. As will be clear to a person having ordinary skill in the art, each voltage sample will be subtracted from its corresponding reverse flow voltage sample prior to calculating the resistance ratio.

Figure 3A:
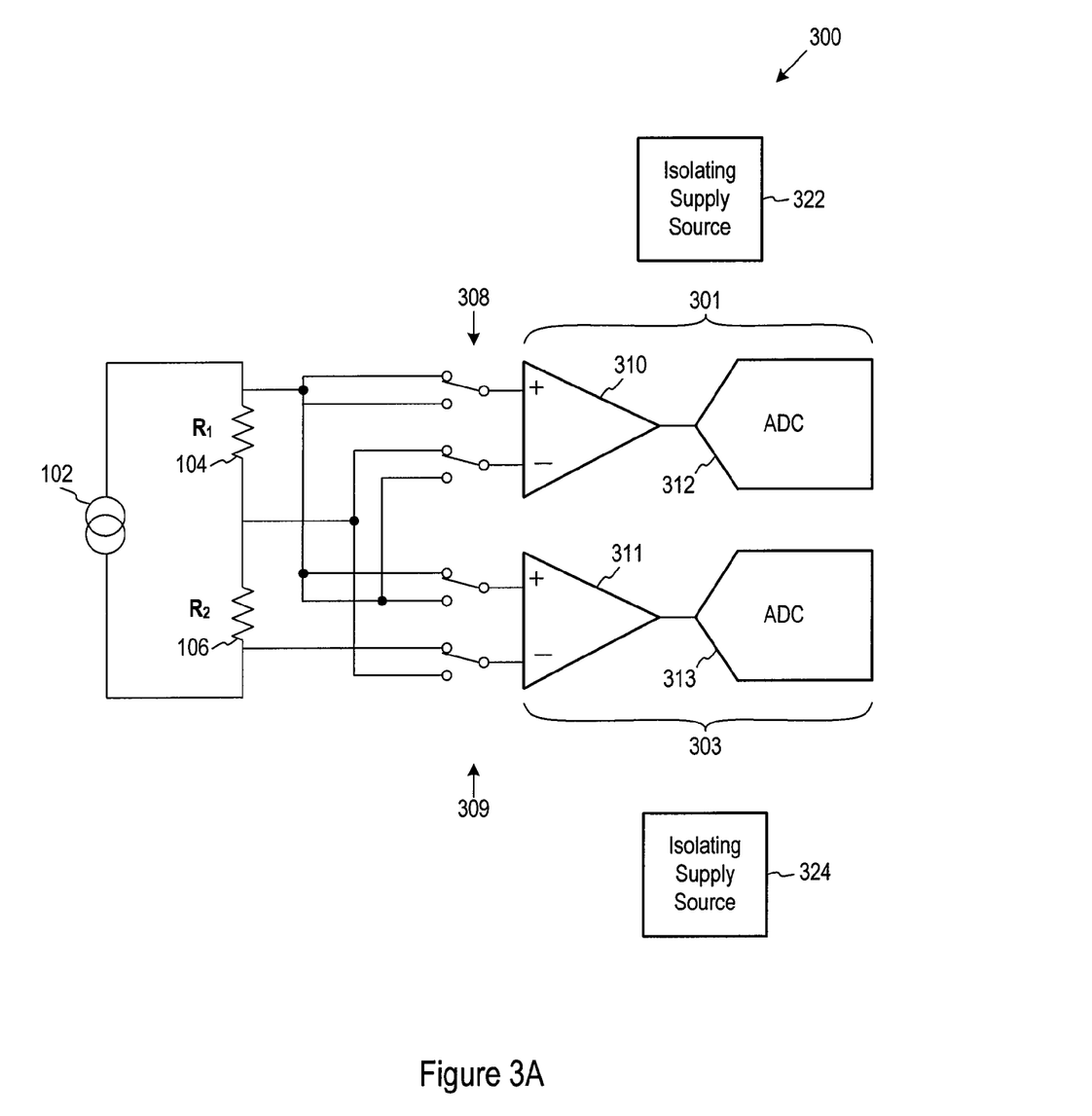
FIG. 3A is a schematic diagram of a resistance bridge measurement circuit in a first state according to one embodiment of the invention.

FIG. 3A is a schematic diagram of a resistance bridge measurement circuit 300 comprising a self-check test according to another embodiment of the invention. Most of the components of the resistance bridge measurement circuit 300 are similar to the components of the resistance bridge measurement circuit 100 of FIG. 1. Therefore, in the interest of brevity, an explanation of their function and structure will not be repeated. The resistance bridge measurement circuit 300 differs from the resistance bridge measurement circuit 100 of FIG. 1 in that the resistance bridge measurement circuit 300 includes two measurement circuits 301 and 303, rather than one. A resistance bridge measurement circuit comprising two measurement circuits is further described in U.S. Application titled "Resistance Bridge Architecture and Method" filed on Jul. 2, 2009, U.S. application Ser. No. 12/497,318, incorporated by reference herein in its entirety. In this embodiment, the resistors $R_1$ 104 and $R_2$ 106 may be external or internal to the resistance bridge measurement circuit 300. As will be discussed in more detail below, by using two measurement circuits 301 and 303, a linearity test may be immune to drift of the current source and unaffected by gain errors of the measurement circuits.

The voltage measurement circuits 301 and 303 may be identical or different from one another. In some embodiments, the voltage measurement circuits 301 and 303 include an amplifier 310 and 311, and an ADC 312 and 313, respectively. Each voltage measurement circuit 301 and 303 are coupled to switches 308 and 309, respectively. The switches 308 and 309 may be similar to the switches 108 described in FIG. 1.

In one embodiment, each voltage measurement circuit 301 and 303 may measure the voltage across resistor $R_1$ 104 and the combination of resistors $R_1$ 104 and $R_2$ 106. In some embodiments, the measurements may be made at substantially the same time. Therefore, noise in the current source will be present in both measurements and once the measurements are presented as ratios, the noise in the current source may be cancelled out. More particularly, in the state the switches 308 and 309 are shown in FIG. 3A, the voltage measurement circuit 301 measures the voltage across the resistor $R_1$ 104 at substantially the same time at which voltage measurement circuit 303 measures the voltage across the combination of resistors $R_1$ 104 and $R_2$ 106. By measuring the voltage across the resistors at substantially the same time, the circuit is configured to be insensitive to changes in current through the resistors during the measurements. As will be clear to a person having ordinary skill in the art, the timing of each voltage measurement may be made simultaneously or sufficiently close together in time such that any noise in the current source is measured in part or in whole by both measurement circuits 301 and 303.

When the switches 308 and 309 change state, the voltage measurement circuit 303 measures the voltage across the resistor $R_1$ 104 and the voltage measurement circuit 301 measures the voltage across the combination of resistors $R_1$ 104 and $R_2$ 106 at substantially the same time. Therefore, each voltage measurement circuit 301 and 303 may make each measurement, the voltage across the resistor $R_1$ 104 and the voltage across the combination of resistors $R_1$ 104 and $R_2$ 106. Thus, any difference in gain errors associated with the two measurement circuits 301 and 303 will not affect the linearity test. More particularly, because both measurement circuits 301 and 303 measure the voltage across resistor $R_1$ 104, any gain errors associated with the measurement circuits 301 and 303 may be determined. For instance, the difference between a voltage $V_1$ measured across resistor $R_1$ 104 measured by measurement circuit 301 and a voltage $V_2$ measured across resistor $R_1$ 104 measured by measurement circuit 303 may indicate the difference in gain of the first and second measurement circuit. Additionally, because both measurement circuits 301 and 303 measure the voltage across the combination of resistors $R_1$ 104 and $R_2$ 106 any change in the current source may be determined. For instance, the difference in a first voltage $V_3$ across the combination of resistors $R_1$ 104 and $R_2$ 106 measured by measurement circuit 301 and a second voltage $V_4$ across the combination of resistors $R_1$ 104 and $R_2$ 106 measured by measurement circuit 303 may indicate whether any changes in current occurred between the first measurement and the second measurement. Therefore, as will be clear to a person having ordinary skill in the art, the circuit may be insensitive to changes in current through the resistors during the measurements and insensitive to differences in gain the first and second measurement circuits.

In one embodiment, the voltage measurements across each respective resistor $R_1$ 104 and the combination of resistors $R_1$ 104 and $R_2$ 106 made by each measurement circuit 301 and 303 may be combined prior to calculating a corresponding ratio, such as a voltage or resistance ratio. In one embodiment, each voltage across resistor $R_1$ 104 measured by each measurement circuit 301 and 303 are averaged together and the voltages across the combination of resistors $R_1$ 104 and $R_2$ 106 measured by each measurement circuit 301 and 303 are averaged together. In a microprocessor the average of the voltages for the resistor $R_1$ 104 and the combination of resistors $R_1$ 104 and $R_2$ 106 are converted to a resistance ratio $R_{R1}/(R_{R1+R2})$. If the value of the resistors $R_1$ 104 and $R_2$ 106 are known, the resistance ratio may be compared to an expected ratio as discussed above.

Figure 3B:
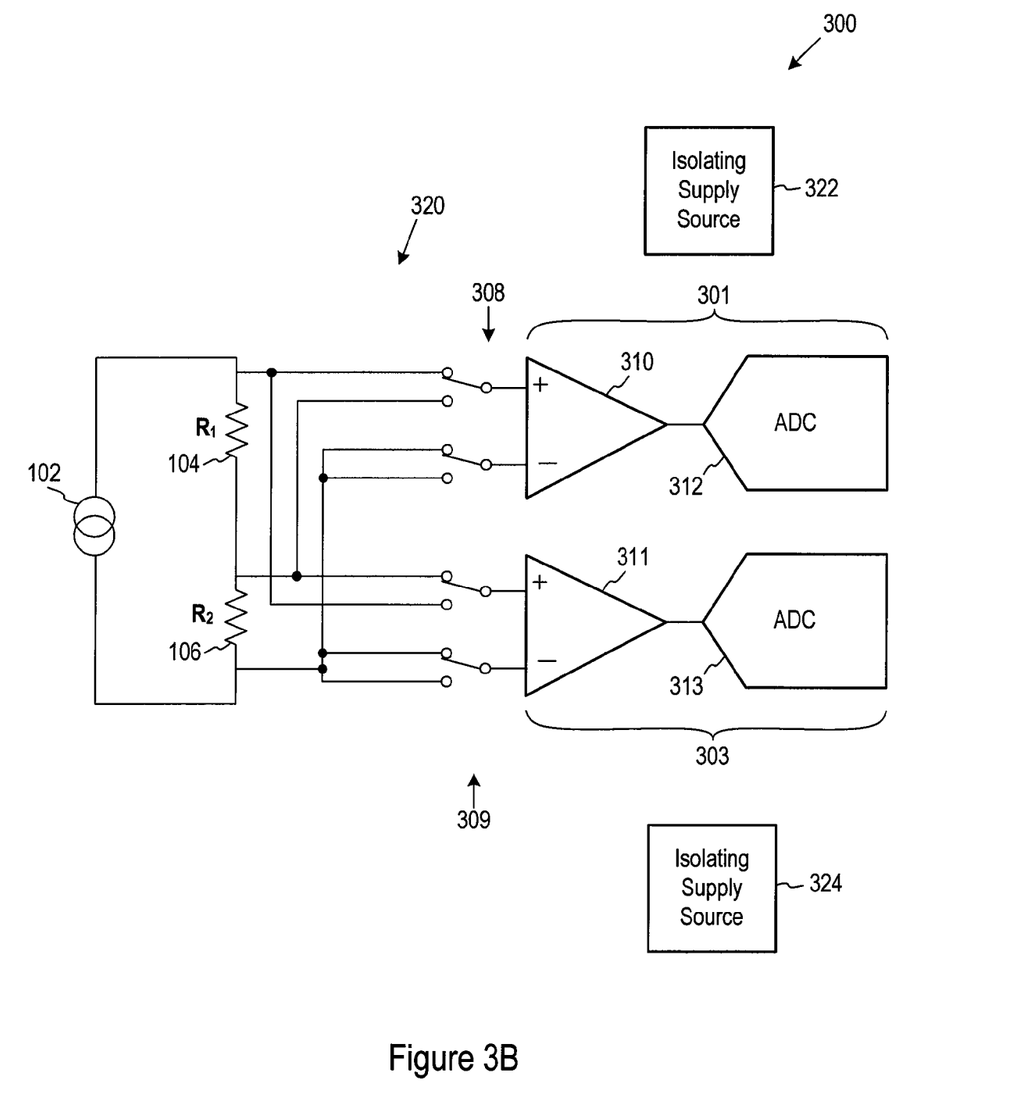
FIG. 3B is a schematic diagram of the resistance bridge measurement circuit in FIG. 3A in a second state according to one embodiment of the invention.

FIG. 3B is a schematic diagram of the resistance bridge measurement circuit in FIG. 3A in a second configuration 320 according to one embodiment of the invention. In the second configuration 320, a second set of measurements may be made such that each measurement circuit 301 and 303 measures the voltage across resistor $R_2$ 106 and the combination of resistors $R_1$ 104 and $R_2$ 106. As will be clear to a person having ordinary skill in the art, a switch (not shown) may be coupled to the resistors $R_1$ 104 and $R_2$ 106 to reconfigure the circuit 300 to the second configuration 320 so that the voltage across resistor $R_2$ 106 may be measured by each measurement circuit 301 and 303 and the voltage across the combination of resistors $R_1$ 104 and $R_2$ 106 may be measured by each measurement circuit 301 and 303. In one embodiment, the voltage measurements across each respective resistor $R_2$ 106 and the combination of resistor $R_1$ 104 and $R_2$ 106 made by each measurement circuit 301 and 303 may be combined prior to calculating a corresponding resistance ratio. For instance, in one embodiment each voltage measurement across $R_2$ 106, one measured by voltage measurement circuit 301 and one measured by voltage measurement circuit 303 are averaged together, and each voltage measurement across the combination of resistor $R_1$ 104 and $R_2$ 106, one measured by voltage measurement circuit 301 and one measured by voltage measurement circuit 303, are averaged together. The average of the voltages for the resistor $R_2$ 106 and the combination of resistors $R_1$ 104 and $R_2$ 106 are converted into a ratio, such as a voltage ratio and/or a corresponding to a resistance ratio. The resistance ratio $R_{R1}/(R_{R1+R2})$ may be added to resistance ratio $R_{R2}/(R_{R1+R2})$. As discussed above, if the sum equals one the resistance bridge is operating linearly.

As will be clear to a person having ordinary skill in the art, when the switch 308 and/or the switch 309 are flipped, each corresponding measurement circuit 301 and 303 changes ground potential relative to the other measurement 301 and 303 and relative to the direction of the current flowing in the circuit. Therefore, in some embodiments the power supply of the measurement circuits 301 may be isolated from the power supply of the measurement circuit 303. For instance, the power supply for each measurement circuit 301 and 303 may be isolated from the other, by a respective isolating supply source 322 and 324, while measurements are being made. In one embodiment, when the measurement circuits 301 and 303 measure the voltage across a respective resistor or combination of resistors $R_1$ 104 and $R_2$ 106, the measurement circuits 301 and 303 may be electrically isolated from one another such that each is powered by a respective energy storage device such as a battery or a capacitor. In between measurements, each energy storage device may be recharged. For instance in one embodiment, each energy storage device may be coupled to a switch-mode power converter operable to recharge the corresponding energy storage device. In one embodiment, the switch-mode power converters are DC-to-DC converters. During measurements, the switch-mode power converters may be decoupled from the energy storage devices and/or powered down. In another embodiment, rather than isolating the power supplies, the amplifier of each measurement circuit 301 and 303 may be used to shift the level to ground potential.

Figure 4:
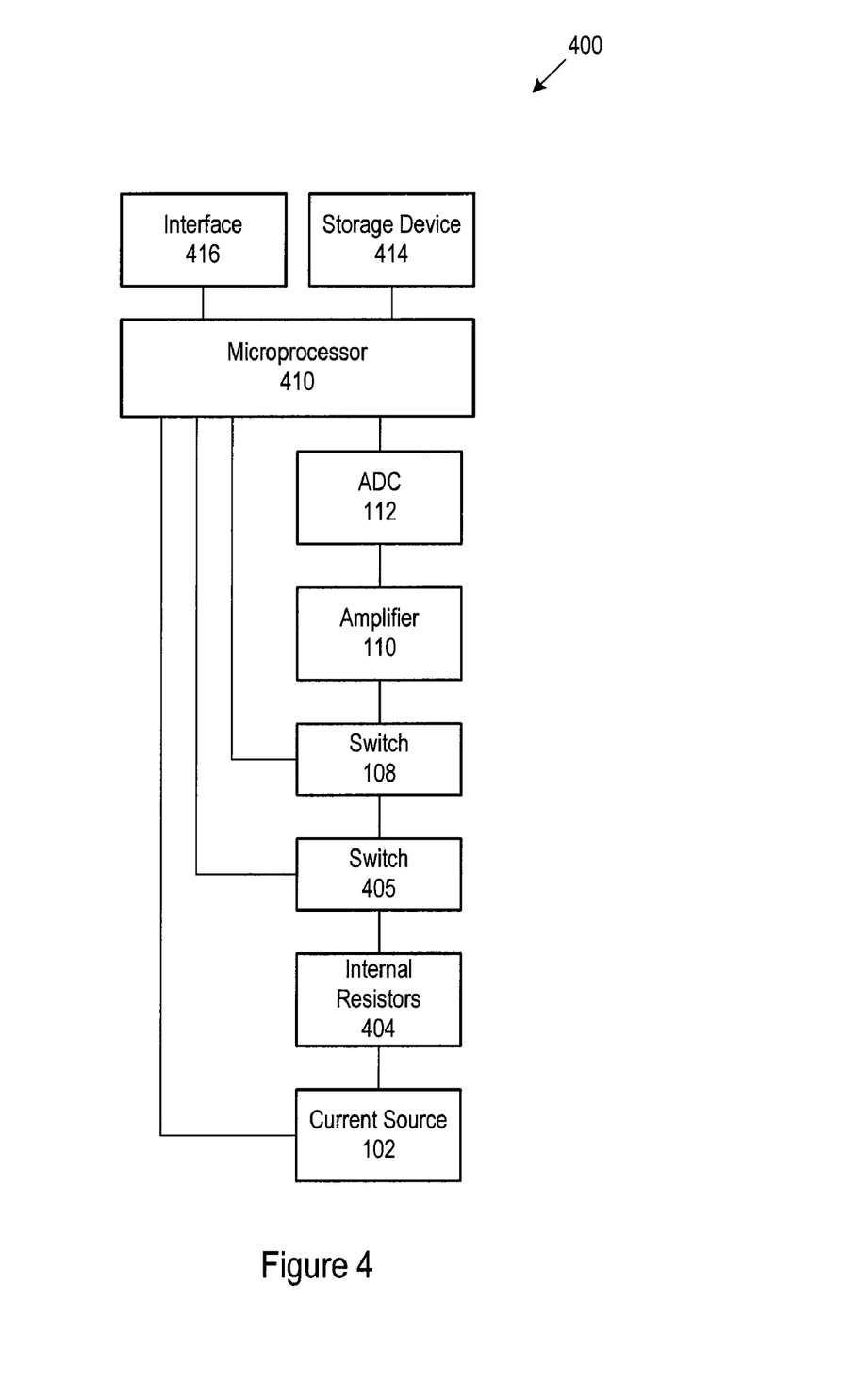
FIG. 4 is a system block diagram comprising a resistance bridge measurement circuit according to one embodiment of the invention.

FIG. 4 is a block diagram of a system 400 comprising a resistor bridge measurement circuit having an internal self-check test according to another embodiment of the invention. Many of the components in the system 400 operate in the same manner as the components in the resistance bridge measurement circuits 100 in FIG. 1 and/or 300 in FIG. 3. Therefore, in the interest of brevity their structure and function may not be repeated. The system 400 may include a microprocessor 410 coupled to an ADC 112, a switch 108, a switch 405, and a current source 102. The microprocessor 410 may be operable to control the operation of the switch 108 and the switch 405. The switch 405 may be operable to reconfigure the circuit from a first state, such as the state shown in FIG. 1A, to a second state, such as the state shown in FIG. 1B. The ADC 112 may be coupled to an amplifier 110. However, in some embodiments the ADC 112 is coupled directly to the switch 108. In other embodiments, there may be two ADCs 112 and two amplifiers 110 working in tandem as discussed in reference to FIG. 3.

The switch 108 may be coupled to a network of internal resistors 404 coupled to a current source and/or a voltage source (not shown). The network of internal resistors 404 may be two or more resistors. The two or more resistors may be coupled in series or parallel or reconfigurable from a first configuration to a second configuration. Alternatively, the network of internal resistors 404 may be two separate sets of resistors, such that each set of resistors comprising at least two resistors coupled to each other, such as in series. The microprocessor 410 may be operable to calculate the resistance ratio from the various measurements made by the amplifier 110 and ADC 112. The microprocessor 410 may be operable to determine the resistance of each internal resistor and determine whether the resistance bridge measurement circuit has linearity using one or more of the methods described above. In some embodiments, the microprocessor 410 may be operable to determine the error of the nonlinearity of the resistance bridge measurement circuit. The microprocessor 410 may be coupled to an interface 416, such as input and/or output devices. In one embodiment, an output device may include a display operable to communicate to a user whether a resistance bridge measurement circuit, such as the resistance bridge measurement circuit 100 in FIG. 1, has nonlinearity and the particular measurement error associated with the nonlinearity. In some embodiments, the microprocessor 410 is coupled to a storage device 414 operable to store data provided from and calculated by the microprocessor 410.

In addition to an internal linearity test, a resistance bridge measurement circuit may be operable to perform an internal compliment check and/or a zero check. An internal compliment check involves comparing a resistance ratio of two resistors to its inverse. For instance, the embodiment of FIG. 1 may be reconfigured such that the measurement circuit measures the voltage across each resistor individually, such as the voltage $V_1$ across $R_1$ 104 and then the voltage $V_2$ across resistor $R_2$ 106. The measurement circuit may then be reconfigured to a second configuration such that the node connections to each resistor are reversed. In this second configuration a second measurement of the voltage $V_3$ across resistor $R_1$ 104 is taken and a second measurement of the voltage $V_4$ across resistor $R_2$ 106 is taken. In a microprocessor, the resultant voltage measurements $V_1$, $V_2$, $V_3$, and $V_4$ are converted to resistance ratios $R_1/R_2$ and $R_3/R_4$. The resistance ratio $R_1/R_2$ may be multiplied by the inverse of $R_3/R_4$ or $R_4/R_3$. If the product is equal to one, then the resistance bridge measurement circuit passes the compliments test.

A zero check involves making a first measurement by measuring the voltage across a first resistor, such as resistor $R_1$ 104 in FIG. 1. A second measurement may be made on the second resistor, such as resistor $R_2$ 106 in FIG. 1. However, for the second measurement, the measurement circuit 101 is only coupled to one node of the second resistor $R_2$ 106, rather than across the resistor. In a microprocessor, a voltage ratio of $V_1/V_2$ may be converted to a resistance ratio and compared to the expected value of zero.

Although the present invention has been described with reference to the disclosed embodiments, persons skilled in the art will recognize that changes may be made in form and detail without departing from the spirit and scope of the invention. For instance, the network of internal resistors may have an unlimited combination. Such modifications are well within the skill of those ordinarily skilled in the art. Accordingly, the invention is not limited except as by the appended claims.

What is claimed is:

1. A resistance bridge, comprising:
a current source;
a first internal resistor coupled to a second internal resistor, the first and second internal resistors coupled to the current source;
a measurement circuit coupled to the first internal resistor at a first node and a second node and coupled to the second internal resistor at the second node and a third node;
one or more switches selectively configurable to cause the measurement circuit to measure a first electrical parameter of the first resistor via the first and second nodes, a second electrical parameter of the second resistor via the second and third nodes, and a third electrical parameter of a combination of the first and second resistors via the first and third nodes; and
a microprocessor coupled to the measurement circuit, the microprocessor being operable to determine whether the resistance bridge has linearity using the first, second, and third measured electrical parameters.

2. The resistance bridge of claim 1 wherein first and second internal resistors are coupled together in series.

3. The resistance bridge of claim 2 wherein the measurement circuit is a voltage measurement circuit and the first electrical parameter is a first voltage across the first internal resistor, the second electrical parameter is a second voltage across the second internal resistor, the third electrical parameter is a third voltage across the combination of the first and second internal resistors.

4. The resistance bridge of claim 3 wherein two internal resistors have substantially equal resistance values.

5. The resistance bridge of claim 4 wherein linearity is determined by converting the first and third voltages to a first ratio and converting the second and third voltages to a second ratio, summing the first and second ratios and comparing the summed ratios to a value of one.

6. The resistance bridge of claim 3 wherein the measurement circuit is operable to measure a fourth voltage across a combination of the first and second internal resistors and wherein determining whether the resistance bridge has linearity comprises converting the first and third voltages to a first resistance ratio, converting the second and fourth voltages to a second resistance ratio, summing the first and second resistance ratios to get a value and comparing the value to a value of one.

7. The resistance bridge of claim 1 wherein the current source is reversible.

8. A resistance bridge for determining linearity, comprising:
a current source;
an internal resistor system configured for performing a linearity test, the internal resistor system including at least two internal resistors coupled together in series and a plurality of selectively configurable switches, the at least two internal resistors coupled to the current source, and not including any resistors that are externally coupled to the resistance bridge;
a first voltage measurement circuit operable to be coupled to the two internal resistors, the first voltage measurement circuit being configured to have a first switch configuration to measure a first voltage across one of the at least two internal resistors and to have a second switch configuration to measure a second voltage across a combination of the at least two internal resistors;
a second voltage measurement circuit operable to be coupled to the two internal resistors, the second voltage measurement circuit being configured to have a third switch configuration to measure a third voltage across only the other of the at least two internal resistors and to have a fourth switch configuration to measure a fourth voltage across a combination of the at least two internal resistors; and
a microprocessor coupled to the voltage measurement circuit, the microprocessor being operable to determine whether the resistance bridge has linearity using the first, second, third and fourth voltages.

9. The system of claim 8 further comprising two switches, each switch configured to couple each voltage measurement circuit to the at least two internal resistors and to decouple each voltage measurement circuit from the at least two internal resistors.

10. The system of claim 8 wherein the at least two resistors have substantially equal resistance values.

11. The system of claim 9 wherein the microprocessor is operable to determine the resistance bridge has linearity by converting the first and second voltages to a first resistance ratio, converting the third and fourth voltages to a second resistance ratio, summing the first and second resistance ratios to get a value and comparing the value to one.

12. The system of claim 11 wherein when the value differs substantially from one the resistance bridge is nonlinear.

13. A method of determining linearity in a resistance bridge having a first internal resistor coupled in series to a second internal resistor and a plurality of switches, comprising:
inducing current through the first and second internal resistors;
configuring the plurality of switches in a first configuration to measure a first voltage across the first internal resistor at a first node and a second node;
configuring the plurality of switches in a second configuration to measure a second voltage across the combination of the first and second internal resistors at the first node and a third node;
configuring the plurality of switches in a third configuration to measure a third voltage across the second internal resistor at the second node and the third node; and using the first, second and third voltages, determining whether the resistance bridge is functioning nonlinearly.

14. The method of claim 13 wherein the act of determining whether the resistance bridge is functioning nonlinearly comprises:
    calculating a first ratio from the first measured voltage and the second measured voltage;
    calculating a second ratio from the second voltage and the third voltage;
    summing the first and second ratios to obtain a summed value; and
    comparing the summed value to a value of one.

15. The method of claim 13 further comprising measuring a fourth voltage across the combination of the first and second resistors and wherein the act of determining whether the resistance bridge is functioning nonlinearly comprises:
    calculating a first ratio from the first measured voltage and the second measured voltage;
    calculating a second ratio from the third voltage and the fourth voltage;
    summing the first and second ratios to obtain a summed value; and
    comparing the summed value to a value of one.

16. The method of claim 13 wherein the resistances of the first and second resistors are unknown.

17. The method of claim 13 wherein the resistance of the first resistor is different from the resistance of the second resistor.

18. The method of claim 14 wherein the resistance bridge is operating nonlinearly when the summed value is substantially different from the value of one.

19. A resistance bridge for determining linearity, comprising:
    a current source;
    an internal resistor system configured for performing a linearity test, the internal resistor system including a first internal resistor coupled to a second internal resistor and a plurality of selectively configurable switches, the first and second internal resistors coupled to the current source, and not including any resistors that are externally coupled to the resistance bridge;
    a measurement circuit coupled to the first and second internal resistors, the measurement circuit being operable to configure the plurality of switches in a first configuration to measure a first electrical parameter of the first internal resistor, in a second configuration to measure a second electrical parameter of the second internal resistor, and in a third configuration to measure a third electrical parameter of a combination of the first and second internal resistors; and
    a microprocessor coupled to the measurement circuit, the microprocessor being operable to determine whether the resistance bridge has linearity using the first, second, and third measured electrical parameters.

20. A method of determining linearity in a resistance bridge having an internal resistor system and a plurality of switches, the method comprising:
    inducing current through the internal resistor system, wherein the internal resistor system includes first and second internal resistors and does not include resistors that are externally coupled to the resistance bridge;
    configuring the plurality of switches in a first configuration to measure a first voltage across the first internal resistor;
    configuring the plurality of switches in a second configuration to measure a second voltage across the combination of the first and second internal resistors;
    configuring the plurality of switches in a third configuration to measure a third voltage across the second internal resistor; and
    using the first, second and third voltages to determine whether the resistance bridge is functioning nonlinearly.

* * * * *

UNITED STATES PATENT AND TRADEMARK OFFICE
CERTIFICATE OF CORRECTION

| | | |
|---|---|---|
| PATENT NO. | : 8,358,143 B2 | |
| APPLICATION NO. | : 12/497296 | |
| DATED | : January 22, 2013 | |
| INVENTOR(S) | : Richard W. Walker | |

It is certified that error appears in the above-identified patent and that said Letters Patent is hereby corrected as shown below:

Delete the title page and substitute therefore with the attached title page consisting of the corrected illustrative figure.

In the Drawings

Please replace FIG. 3A with FIG. 3A as shown on the attached page.

Signed and Sealed this
Nineteenth Day of July, 2016

Michelle K. Lee
*Director of the United States Patent and Trademark Office*

United States Patent
Walker (10) Patent No.: US 8,358,143 B2
(45) Date of Patent: Jan. 22, 2013

(54) INTERNAL SELF-CHECK RESISTANCE BRIDGE AND METHOD

(75) Inventor: Richard W. Walker, Alpine, UT (US)

(73) Assignee: Fluke Corporation, Everett, WA (US)

( * ) Notice: Subject to any disclaimer, the term of this patent is extended or adjusted under 35 U.S.C. 154(b) by 457 days.

(21) Appl. No.: 12/497,296

(22) Filed: Jul. 2, 2009

(65) Prior Publication Data
US 2011/0001503 A1   Jan. 6, 2011

(51) Int. Cl.
G01R 27/08   (2006.01)

(52) U.S. Cl. .................................. 324/706

(58) Field of Classification Search ........ 324/706, 324/705, 691, 649, 600
See application file for complete search history.

(56) References Cited

U.S. PATENT DOCUMENTS
3,676,774 A * 7/1972 Stokes et al. ........ 324/706
5,371,469 A   12/1994 Anderson
2011/0001502 A1   1/2011 Walker

FOREIGN PATENT DOCUMENTS
FR   2637985 A1   4/1990

OTHER PUBLICATIONS

"Extended European Search Report dated Dec. 9, 2010 regarding Application No. 10167912.4".
Anonymous, "Operator Manual for Resistance Bridge Calibrators", RBC operators manual, Dec. 2007, pp. 1-41.
Parks, James E., "Ohm's Law III—Resistors in Series and Parallel", Aug. 2007, pp. 1-18.
Walker, R. et al., "Achieving 0.25 mK Uncertainty with an Integrated-Circuit Resistance Thermometer Readout", Proceedings, XVII IMEKO World Congress, Jun. 22-27, 2003, pp. 1594-1597.
Lacanette, K., "Data-Acquisition System Simplifies 5V RTD-to-Digital Conversion," 41(24):102, EDN—Electrical Design News, Nov. 1996.

* cited by examiner

*Primary Examiner* — Hoai-An D Nguyen
(74) *Attorney, Agent, or Firm* — Christensen O'Connor Johnson Kindness PLLC (57) ABSTRACT

One or more embodiments are directed to a resistance bridge measurement circuit configured to perform an internal self-check. The resistance bridge measurement circuit may include two or more internal resistors. In one embodiment, the resistance bridge measurement circuit may be configured to measure a first voltage across one of the resistors and a second voltage across a combination of the two resistors. The measured voltages may be converted to a resistance ratio and compared to an expected value. In another embodiment, the resistance bridge measurement circuit may be configured to measure a third voltage across the other of the two resistors and a fourth voltage across a combination of the two resistors. The measured voltages may be converted to corresponding resistance ratios, summed and compared to an expected value.

20 Claims, 5 Drawing Sheets

Figure 3A